(12) United States Patent
Kim et al.

(10) Patent No.: US 9,368,755 B2
(45) Date of Patent: Jun. 14, 2016

(54) ORGANIC LIGHT EMITTING DEVICE

(71) Applicant: LG DISPLAY CO., LTD., Seoul (KR)

(72) Inventors: Ji Hee Kim, Daejeon (KR); Jung Bum Kim, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/477,468

(22) Filed: Sep. 4, 2014

(65) Prior Publication Data
US 2014/0367672 A1 Dec. 18, 2014

Related U.S. Application Data

(63) Continuation of application No. PCT/KR2013/002464, filed on Mar. 25, 2013.

(30) Foreign Application Priority Data

Mar. 23, 2012 (KR) .................. 10-2012-0030250
Jul. 31, 2012 (KR) .................. 10-2012-0084218

(51) Int. Cl.
| | | |
|---|---|---|
| H01L 29/08 | (2006.01) |
| H01L 27/15 | (2006.01) |
| H01L 29/22 | (2006.01) |
| H01L 51/52 | (2006.01) |
| H05B 33/10 | (2006.01) |
| H05B 33/22 | (2006.01) |

(52) U.S. Cl.
CPC ........ *H01L 51/5271* (2013.01); *H01L 51/5268* (2013.01); *H01L 51/5275* (2013.01); *H05B 33/10* (2013.01); *H05B 33/22* (2013.01); *H01L 2251/5315* (2013.01)

(58) Field of Classification Search
CPC ............ H01L 51/5271; H01L 51/5203; H01L 51/5237; H01L 51/5088; H01L 51/5092; H01L 51/5268
USPC ......... 257/40, 79, 80–84, 88–90, 98
See application file for complete search history.

(56) References Cited

U.S. PATENT DOCUMENTS

| | | | |
|---|---|---|---|
| 6,833,667 B2 | 12/2004 | Hamano et al. | |
| 8,687,145 B2 * | 4/2014 | Lee et al. | ............ 349/65 |
| 2006/0250084 A1 | 11/2006 | Cok et al. | |
| 2008/0169757 A1 | 7/2008 | Chang et al. | |
| 2009/0097234 A1 * | 4/2009 | von Malm | ......... 362/103 |
| 2010/0187987 A1 | 7/2010 | Nakamura | |
| 2011/0050082 A1 * | 3/2011 | Inoue et al. | ......... 313/483 |
| 2011/0163659 A1 | 7/2011 | Lang et al. | |
| 2013/0026461 A1 | 1/2013 | Nakamura | |

FOREIGN PATENT DOCUMENTS

| | | |
|---|---|---|
| CN | 101006593 A | 7/2007 |
| CN | 101006753 A | 7/2007 |
| CN | 101682001 A | 3/2010 |
| CN | 102201544 A | 9/2011 |
| CN | 102299266 A | 12/2011 |

(Continued)

*Primary Examiner* — Hsien Ming Lee
(74) *Attorney, Agent, or Firm* — Dentons US LLP

(57) ABSTRACT

The present application relates to an organic light emitting device (OLED) and lighting devices. The exemplary OLED according to the present application, for example, may minimize evanescent coupling caused by surface plasmons, and the like, and may have excellent emission efficiency.

14 Claims, 8 Drawing Sheets

(56) References Cited

FOREIGN PATENT DOCUMENTS

| | | |
|---|---|---|
| JP | 2004-349064 | 12/2004 |
| JP | 2006054197 | 2/2006 |
| JP | 2008-234930 | 10/2008 |
| JP | 2010-182677 | 8/2010 |
| JP | 2011-048937 | 3/2011 |
| JP | 2011-513958 A | 4/2011 |
| KR | 1020120024510 A | 3/2012 |
| TW | 200534746 A | 9/2006 |
| TW | 200913767 | 3/2009 |
| WO | 2006033312 A1 | 3/2006 |
| WO | 2006035625 A1 | 4/2006 |
| WO | 2011/126097 | 10/2011 |

* cited by examiner

ORGANIC LIGHT EMITTING DEVICE

This application is a Continuation Bypass of International Application PCT/KR2013/002464, with an international filing date of Mar. 25, 2013, which claims priority to and the benefit of Korean Patent Application No. 10-2012-0030250, filed on Mar. 23, 2012, and Korean Patent Application No. 10-2012-0084218, filed on Jul. 31, 2012, all of which are incorporated herein by reference in their entirety.

BACKGROUND

1. Field of the Invention

The present application relates to an organic light emitting device (OLED) and a use thereof.

2. Discussion of Related Art

A typical OLED sequentially includes a substrate layer, a first electrode, an organic layer including at least an emitting layer and a second electrode.

In a structure called as a so-called bottom emitting device, the first electrode may be a transparent electrode, and the second electrode may be a reflective electrode. Also, in a structure called as a so-called top emitting device, the first electrode may be formed by a reflective electrode and the second electrode may be formed by a transparent electrode. Electron and hole are injected respectively by the two electrode, and the injected electron and hole are recombined in the emitting layer, resulting in generating light. The light may be emitted to the substrate layer in the bottom emitting device or to the second electrode in the top emitting device.

In the structure of the OLED, indium tin oxide (ITO) generally used as the transparent electrode, the organic layer, and the substrate layer, which is conventionally formed of glass, have refractive indexes of about 2.0, 1.8 and 1.5, respectively. In such a relationship of the refractive index, for example, the light generated in the organic emitting layer in the bottom emitting device is trapped by total internal reflection phenomenon between the organic layer and the interface of the first electrode or in the substrate and a very small amount of light is only emitted.

SUMMARY OF THE INVENTION

The present application is directed to providing an OLED and a use thereof.

As an example, an OLED may include a first transparent electrode layer and a second transparent electrode layer, and an organic layer formed between the two transparent electrode layers. The organic layer may have at least one functional organic layer, or a structure in which at least two functional layers are stacked. The organic layer may include, for example, at least an emitting layer.

The OLED may further include a reflecting plate located outside of the first or second transparent electrode layer. As the reflecting plate may be applied, for example, a reflecting plate having measured reflexibility of 80% or more, 85% or more, 90% or more or 95% or more, relative to light of a wavelength of 550 nm. The reflexibility of the reflecting plate is possibly measured by using a conventional visible spectrophotometer. The reflexibility may be measured by measuring a ratio of a speed of transmitted, absorbed or reflected light, relative to a speed of incident light through a visible spectrophotometer. Any reflecting plate may be used as long as it exhibits the above reflexibility. As the reflecting plate may be used, for example, a reflective material such as a dielectric minor, silver (Ag), $BaSO_4$ or aluminum. For example, a film, sheet or substrate prepared of the above material, or a structure in which a layer of the above material is formed on a suitable substrate may be used as a reflecting plate. The sentence "the reflecting plate is located outside of the first or second transparent electrode layer" used herein may indicate that, for example, in a structure in which the first and second transparent electrode layers face each other and the organic layer is located therebetween, the reflecting plate is located on an opposite side of a surface of the first or second transparent electrode layer in contact with the organic layer.

In the OLED, the reflecting plate may be disposed apart from the emitting layer by a gap of about 100 nm or more, 200 nm or more or 300 nm or more. The upper limit of the gap may be, but the present invention is not particularly limited to, about 700 nm or less, 650 nm or less, 600 nm or less, 550 nm or less, 500 nm or less, 450 nm or less, 400 nm or less, 350 nm or less, 300 nm or less, 250 nm or less or 200 nm or less. Here, for example, when the organic layer includes at least two emitting layers as to be described later, the gap between the emitting layer and the reflecting plate may be a distance between the reflecting plate and one of the at least two emitting layers relatively close thereto. As the gap of the emitting layer is maintained within the above range, a surface plasmon effect or degradation of light efficiency relative to metal, and the like, in the device may be prevented, and a device exhibiting excellent efficiency may be provided.

The OLED may further include a scattering layer. For example, the scattering layer may be located between the reflecting plate and one of the first and second electrode layers in contact with the reflecting plate.

For example, the OLED may further include a substrate layer, and have a structure in which a first or second transparent electrode layer, an organic layer and a second or first transparent electrode layer are sequentially formed on the top of the substrate layer, the reflecting plate is located outside of the substrate layer, and the scattering layer is located between the substrate layer and the first or second transparent electrode layer formed on the top of the substrate layer.

FIG. 1 shows an exemplary structure (100) of the OLED, in which a second transparent electrode layer (101), an organic layer (102), a first transparent electrode layer (103), a scattering layer (104), a substrate layer (105) and a reflecting plate (106) are sequentially formed.

In the above structure, as the substrate layer, a suitable material may be used as needed without particular limitation. In one example, as the substrate layer, a transparent substrate layer, for example, a substrate layer having a transmittance relative to light having a wavelength in a visible range of 50%, 60%, 70%, 80% or 90% or more, may be used. As the transparent substrate layer, a glass or transparent polymer substrate layer may be used. As the glass substrate layer, a substrate layer including soda lime glass, barium/strontium-containing glass, lead glass, alumino silicate glass, borosilicate glass, barium borosilicate glass, or quartz may be used, and as the polymer substrate layer, a substrate layer including polycarbonate (PC), an acryl resin, poly(ethylene terephthalate) (PET), poly(ether sulfide) (PES), or polysulfone (PS) may be used, but the present invention is not limited thereto.

The substrate layer may have a suitable thickness in consideration of, for example, light transmittance, mechanical strength or weight. A thickness of the conventional substrate layer may be, for example, approximately 0.1 mm to 10 mm, 0.3 mm to 5 mm, or 0.5 mm to 2 mm.

Among the first and second transparent electrode layers included in the OLED, one may be a hole injection electrode, and the other may be an electron injection electrode. Hereinafter, in the specification, for the convenience of description, the device having the structure as shown in FIG. 1 will be described, provided that the electrode layer (103) formed on the top of the substrate layer (105), which is a transparent hole injection electrode layer, is a first electrode layer, and the other electrode layer (101), which is a transparent electron injection electrode layer, is a second electrode layer, but positions or characteristics of the first and second transparent electrode layers in the device are not limited thereto.

The electrode layer, which is substantially transparent and hole injectable, may be formed by using, for example, a transparent material having a relatively high work function. For example, the hole injection electrode layer may include a metal, an alloy, an electric conductive compound having a work function of about 4.0 eV or more, or a mixture of at least two thereof. Such a material may be a metal such as gold, CuI, ITO, indium zinc oxide (IZO), zinc tin oxide (ZTO), aluminum- or indium-doped zinc oxide, magnesium indium oxide, nickel tungsten oxide, an oxide material such as ZnO, $SnO_2$ or $In_2O_3$, a metal nitride such as gallium nitride, a metal selenide such as zinc selenide or a metal sulfide such as zinc sulfide. A transparent hole injection electrode layer may also be formed by using a metal thin film such as Au, Ag or Cu and a stacked structure of a high refractive transparent material such as ZnS, $TiO_2$ or ITO.

The transparent hole injection electrode layer may be formed by an optional means such as deposition, sputtering, chemical deposition, or electrochemical means. Also, if necessary, the formed electrode layer may be patterned through known photolithography or a process using a shadow mask. A thickness of the hole injection electrode layer may vary depending on light transmittance or surface resistance, and may be conventionally within a range of 500 nm or 10 nm to 200 nm.

A transparent electron injection electrode layer may be formed by, for example, using a transparent material having a relatively low work function, or for example, may be formed by using a suitable material of the materials used to form the hole injection electrode layer, but the present invention is not limited thereto. The electron injection electrode layer may also be formed by, for example, deposition or sputtering, and if necessary, may be suitably patterned. The electron injection electrode layer may be formed to have a suitable thickness as needed.

The organic layer located between the electron and hole injection electrode layer includes at least one emitting layer. The organic layer may include multiple, for example, at least two emitting layers. When at least two emitting layers are included, the at least two emitting layers may be in contact with or separated from each other or if necessary, may be divided by an inter-electrode layer having a charge generating characteristic or a charge generating layer (CGL), but the present invention is not limited thereto.

The emitting layer may be formed by using, for example, various fluorescent or phosphorescent organic materials known in the art. An example of the material capable of being used in the emitting layer may be, but the present invention is not limited to, a phosphorescent material such as an Alq-based material such as tris(4-methyl-8-quinolinolate)aluminum(III) (Alg3), 4-MAlq3, or Gaq3; a cyclopentadiene derivative such as C-545T($C_{26}H_{26}N_2O_2S$), DSA-amine, TBSA, BTP, PAP-NPA, spiro-FPA, $Ph_3Si$ (PhTDAOXD), 1,2,3,4,5-pentaphenyl-1,3-cyclopentadiene (PPCP); 4,4'-bis(2,2'-diphenylvinyl)-1,1'-biphenyl (DPVBi), distyryl benzene, or a derivative thereof; or 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (FIrppy), or bis(2-(2'-benzo[4,5-a]thienyl)pyridinato-N,C3') iridium(acetylactonate) ($Btp_2Ir(acac)$). The emitting layer may include the material as a host, and a host-dopant system including perylene, distyrylbiphenyl, DPT, quinacridone, rubrene, BTX, ABTX, or DCJTB as a dopant.

The emitting layer may also be formed by suitably employing any one of an electron accepting organic compound and an electron donating organic compound exhibiting emitting characteristics, which will be described later.

The organic layer may be formed in various structures further including various functional layers known in the art, as long as the emitting layer is included. As a layer capable of being included in the organic layer, an electron injection layer, a hole blocking layer, an electron transport layer, a hole transport layer and a hole injection layer may be used.

Here, the electron injection layer or electron transport layer may be formed by using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene, or a derivative thereof; a metal chelate complex compound disclosed in a patent publication such as Japanese Patent Application Laid-Open No.1988-295695, Japanese Patent Application Laid-Open No.1996-22557, Japanese Patent Application Laid-Open No.1996-81472, Japanese Patent Application Laid-Open No.1993-009470, or Japanese Patent Application Laid-Open No.1993-017764, for example, a metal complex having at least one of metal chelated oxinoid compounds such as 8-quinolatos including tris (8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Application Laid-Open No.1993-202011, Japanese Patent Application Laid-Open No.1995-179394, Japanese Patent Application Laid-Open No.1995-278124, or Japanese Patent Application Laid-Open No.1995-228579; a triazine compound disclosed in the patent publication such as Japanese Patent Application Laid-Open No.1995-157473; a stilbene derivative disclosed in a patent publication such as Japanese Patent Application Laid-Open No.1994-203963; a distyrylarylene derivative; a styryl derivative disclosed in a patent publication such as Japanese Patent Application Laid-Open No.1994-132080 or Japanese Patent Application Laid-Open No.1994-88072; a diolefin derivative disclosed in a patent publication such as Japanese Patent Application Laid- Open No.1994-100857 or Japanese Patent Application Laid-Open No.1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis (3-ethylstyryl)benzene, 1,4-bis (2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis (4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidene compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-tibutylphenylvinyl)biphenyl, 4,4'-(2,2-diphenylvinyl)biphenyl, or a derivative thereof; a silanamine derivative disclosed in a patent publication such as Japanese Patent Application Laid-Open No.1994-49079 or Japanese Patent Application Laid-Open No.1994-293778; a multifunctional styryl compound disclosed in a patent publication such as Japanese Patent Application Laid-Open No.1994-279322 or Japanese Patent Application Laid-Open No.1994-279323; an oxadiazole derivative disclosed in a patent publication such as Japanese Patent Application Laid-Open No.1994-107648 or Japanese Patent Application Laid-Open No.1994-092947; an anthracene compound disclosed in a patent publication such as Japanese Patent Application Laid-Open No.1994-206865; an oxinate derivative disclosed in a patent publication such as Japanese Patent Application Laid-Open No.1994-145146; a tetraphenyl butadiene compound disclosed in a patent publication such as Japanese Patent Application Laid-Open No.1992-96990; an organic trifunctional compound disclosed in a patent publication such as Japanese Patent Application Laid-Open No.1991-296595; a coumarin derivative disclosed in a patent publication such as Japanese Patent Application Laid-Open No.1990-191694; a perylene derivative disclosed in a patent publication such as Japanese Patent Application Laid-Open No.1990-196885; a naphthalene derivative disclosed in a patent publication such as Japanese Patent Application Laid-Open No.1990-255789; a phthaloperynone derivative disclosed in a patent publication such as Japanese Patent Application Laid-Open No.1990-289676 or Japanese Patent Application Laid-Open No.1990-88689; or a styryl amine derivative disclosed in a patent publication such as Japanese Patent Application Laid-Open No.1990-250292 may be used as an electron accepting organic compound included in a low refractive layer. In addition, here, the electron injection layer may be formed using, for example, a material such as LiF or CsF.

The hole blocking layer may be a layer capable of enhancing a life span and efficiency of the device by preventing approach of holes injected from a hole injection electrode layer to an electron injection electrode layer through the emitting layer, and may be formed in a suitable part between the emitting layer and the electron injection electrode layer using a known material when necessary.

The hole injection layer or the hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis [N-(1-coronenyl)-N-phenylamino]biphenyl, 2,6-bis(di-p-tollylamino)naphthalene, 2,6-bis[di-(1-naphthyl)amino] naphthalene, 2,6-bis[N-(1-naphthyl)-N-(2-naphthyl)amino] naphthalene, 4,4''-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorine, or 4,4'-bis(N,N-di-p-tollylamino)terphenyl, or an aryl amine compound such as bis(N-1-naphthyl)(N-2-naphthyl)amine may be used, but the present invention is not limited thereto.

The hole injection layer or the hole transport layer may be formed by dispersing the organic compound in a polymer or using a polymer derived from the organic compound. Also, so-called a π-conjugated polymer such as polyparaphenylenevinylene and a derivative thereof, a hole transport non-conjugated polymer such as poly(N-vinylcarbazole), and the like, or a σ-conjugated polymer, and the like of polysilane may be used.

The hole injection layer may be formed by using an electrically conductive polymer such as metal phthalocyanine such as copper phthalocyanine or non-metal phthalocyanine, a carbon layer and an electrically conductive polymer such as polyaniline, or may be formed by reaction with a Lewis acid using the aryl amine compound as an oxidizing agent.

The organic layer may be formed in various structures including the above layers. For example, the organic layer may be formed in a type including an emitting layer and an electron transport layer; an emitting layer, an electron transport layer and an electron injection layer; a hole transport layer, an emitting layer and an electron transport layer; a hole injection layer, a hole transport layer, an emitting layer and an electron transport layer; a hole transport layer, an emitting layer, a hole blocking layer and an electron transport layer; a hole injection layer, a hole transport layer, an emitting layer, a hole blocking layer and an electron transport layer; a hole transport layer, an emitting layer, an electron transport layer and an electron injection layer; or a hole injection layer, a hole transport layer, an emitting layer, an electron transport layer and an electron injection layer, which are sequentially formed from a hole injection electrode layer, but the present invention is not limited thereto. As mentioned above, if necessary, the organic layer may have a structure including at least two emitting layers.

The OLED also includes a scattering layer. The scattering layer may be a layer capable of increasing light extraction efficiency of the device through interaction with the reflecting plate and the like, and formed by optional known materials and a known structure, which may scatter incident light.

In one embodiment, the scattering layer may be a layer including scattering particles. FIG. 2 shows that a scattering layer including scattering particles (201) is formed on a substrate layer (105). The scattering layer of FIG. 2 includes scattering particles (201) and a binder (202).

The term "scattering particles" may refer to, for example, particles capable of scattering incident light due to a different refractive index from the binder for forming the scattering layer or a planarized layer to be described later, and a suitable size. Such particles may have a refractive index of 1.0 to 3.5, preferably, approximately 1.0 to 2.0, 1.2 to 1.8, 2.1 to 3.5, or 2.2 to 3.0, and an average diameter of approximately 50 nm to 20,000 nm or 100 nm to 5,000 nm. The term "refractive index" used herein may refer to, unless particularly defined otherwise, a refractive index measured by using light having a wavelength of 400 nm to 450 nm in a vacuum. The particles may have a spherical, oval, polygonal, or amorphous shape, but the shape thereof is not particularly limited thereto. The scattering particles may include, for example, an organic material such as polystyrene or a derivative thereof, an acryl resin or a derivative thereof, a silicon resin or a derivative thereof, or a novolac resin or a derivative thereof, or an inorganic material such as silica, alumina, titanium oxide, or zirconium oxide. The scattering particles may include any one of the materials, or at least two thereof, or may be formed as core/shell-type particles or hollow-type particles as needed.

The scattering layer may further include a binder maintaining the scattering particles. As the binder, for example, as a material capable of maintaining the scattering particles, another adjacent material, for example, a material having the same refractive index as the substrate layer (105), may be used. The binder may be, for example, a heat or photo curable monomeric, oligomeric, or polymeric organic material including polyimide, a caldo resin having a fluorine ring, urethane, epoxide, polyester or acrylate, an inorganic material such as silicon oxide, silicon nitride, silicon oxynitride, or polysiloxane or an organic/inorganic combination material, and the like.

The scattering layer may be, for example, a layer having an uneven structure. FIG. 3 shows that a scattering layer (301) having an uneven structure is formed on a substrate layer (105). When the uneven structure of the scattering layer is suitably controlled, incident light may be scattered.

The scattering layer having an uneven structure may be formed by, for example, coating a heat or photo curable material, and curing the material in contact with a mold capable of transferring a desired shape of the uneven structure during curing, or performing etching. Alternatively, the scattering layer may be formed by blending particles having suitable size and shape in the binder for forming a scattering layer. In this case, the particles need not be particles having a scattering function, but particles having a scattering function may also be used.

For example, the scattering layer may be formed by coating a material by a wet coating method, and performing application of heat or irradiation of light, curing of the material by a sol-gel method, deposition such as chemical vapor deposition (CVD) or physical vapor deposition (PVD), or microembossing.

The OLED may further include a planarized layer formed on the top of the scattering layer.

FIGS. 4 and 5 are exemplary OLEDs further including a planarized layer. In FIG. 4, a planarized layer (401) is formed on a scattering layer having the structure shown in FIG. 2, and in FIG. 5, a planarized layer (401) is formed on a scattering layer having the structure shown in FIG. 3.

The planarized layer provides a surface of the scattering layer on which an electrode layer is formed, and exhibits more excellent light extraction efficiency through interaction with the scattering layer. The planarized layer may have the same refractive index as an adjacent electrode layer, for example, approximately 1.8 to 3.5 or 2.2 to 3.0. The planarized layer may be formed by mixing high refractive particles having a high refractive index, and an average diameter of, for example, 1 nm to 100 nm, 10 nm to 90 nm, 20 nm to 80 nm, 30 nm to 70 nm, 30 nm to 60 nm or 30 nm to 50 nm with a binder for forming the planarized layer. As high refractive particles, for example, alumina, titanium oxide or zirconium oxide may be used. In an example, as the high refractive particles, titanium oxide, for example, rutile-type titanium oxide may be used. The rutile-type titanium oxide has a higher refractive index than other particles. Therefore, when the high refractive particles are included in the material for forming a planarized layer at a relatively small amount, the planarized layer having a high refractive index may be embodied. When the high refractive particles are included in the material at a relatively low level, a planarized layer having a higher quality may be embodied.

In another example, the planarized layer may be formed by using a material prepared by blending a compound such as an alkoxide or acylate of a metal such as zirconium, titanium, or cerium with a binder having a polar group such as a carboxyl group or a hydroxyl group. The compound such as an alkoxide or acylate may be condensed with the polar group of the binder, and provide the metal to a backbone of the binder, thereby embodying a high refractive index. Examples of the alkoxide or acylate compound may include a titanium alkoxide such as tetra-n-butoxy titanium, tetraisopropoxy titanium, tetra-n-propoxy titanium, or tetraethoxy titanium, a titanium acylate such as titanium stearate, a titanium chelate, a zirconium alkoxide such as tetra-n-butoxy zirconium, tetra-n-propoxy zirconium, tetraisopropoxy zirconium, or tetraethoxy zirconium, a zirconium acylate such as zirconium tributoxystearate, or a zirconium chelate. In addition, as a binder having the polar group, a suitable kind of the binders described in the category of the scattering layer may be selected for use.

The planarized layer also may be formed by a sol-gel coating method including preparing a coating solution by blending a metal alkoxide such as a titanium alkoxide or a zirconium alkoxide with a solvent such as alcohol or water, applying the coating solution, and plasticizing the coated solution at a suitable temperature.

The scattering layer or the scattering layer and the planarized layer formed thereon may have a smaller projection area than the first or second transparent electrode layer formed on the planarized layer. The scattering layer or the scattering layer and the planarized layer may also have a smaller projection area than the substrate layer. The term "projection area" used herein refers to an area of projecting a target recognized when the OLED or the substrate layer described above is observed from above in a direction of a normal line of a surface thereof, for example, an area of the substrate layer, the scattering layer, or the electrode layer. Accordingly, for example, when an area recognized by observing the scattering layer from above is smaller than that recognized by observing the electrode layer from above although a substantial surface area is larger than that of the electrode layer because a surface of the scattering layer is formed in an uneven shape, it is construed that the scattering layer has a smaller projection area than the electrode layer.

The scattering layer may be present in various types as long as it has a projection area smaller than the substrate layer and the electrode layer. For example, as shown in FIG. 6, a scattering layer (104) may be formed only in a part other than the edge of a substrate layer (105), or as shown in FIG. 7, a scattering layer (104) may partially remain at an edge of a substrate layer (105).

FIG. 8 shows the scattering layer of FIG. 6 when being observed from above. As shown in FIG. 8, an area(A), that is, a projection area(A), of the electrode layer (103) recognized when the scattering layer is observed from above is formed to be larger than a projection area(B) of the scattering layer (104) disposed therebelow. A ratio(A/B) of the projection area(A) of the electrode layer (103) and the projection area(B) of the scattering layer may be, for example, 1.04 or more, 1.06 or more, 1.08 or more, 1.1 or more, or 1.15 or more. When the projection area of the scattering layer is smaller than that of the electrode layer, a structure in which the scattering layer is not exposed to an external environment is possibly embodied as will be described later, and thus the upper limit of the ratio(A/B) of the projection area is not particularly limited. In consideration of a general manufacturing environment, the upper limit of the ratio(A/B) may be, for example, about 2.0, about 1.5, about 1.4, about 1.3 or about 1.25. Here, the electrode layer may also be formed on the top of the substrate layer on which the scattering layer is not formed. The electrode layer may be formed in contact with the substrate layer, or by including an additional component between the electrode layer and the substrate layer. According to such a structure, a structure in which the scattering layer is not exposed to an external environment may be embodied.

For example, as shown in FIG. 8, an electrode layer may be formed in a region including a region beyond all peripheral regions of the scattering layer when observed from above. In this case, for example, as shown in FIG. 7, when a plurality of scattering layers (104) are located on the substrate layer, the electrode layer (103) may be formed in the region including the region beyond all of the peripheral regions of at least one of the scattering layers (104), for example, the scattering layer on which at least an organic layer is present. For example, in the structure of FIG. 7, when the organic layer is formed on the top of the scattering layer located on right and left edges thereof, the structure of FIG. 7 may be changed to form the electrode layer up to the region beyond all of the peripheral regions of the scattering layer located on the right and left edges by being extended to left and right sides. In the above structure, a structure in which the scattering layer is not exposed to an external environment may be formed by attaching an encapsulating structure to be described later to the electrode layer below which the scattering layer is not formed. Accordingly, penetration of external moisture or oxygen through the scattering layer and the planarized layer may be prevented, an attaching strength between the encapsulating structure, the electrode layer and the substrate layer, or attachment between an external power and the electrode layer may be stably ensured, and a surface hardness of the edge of the device may be excellently maintained.

Control of the projection area may be performed, for example, by forming the electrode layer to have a larger projection area than the scattering layer during a deposition or sputtering process for forming the electrode layer, and when necessary, a light extraction layer may be patterned by removing a predetermined part of the scattering layer and/or planarized layer.

The OLED may include a reflecting plate located outside of the first or second transparent electrode layer. For example, in the structure of FIG. 1, light propagating to the first electrode layer (103) among lights generated from the organic layer propagates to the reflecting plate (106) through the scattering layer (104) and the substrate layer (105), and is reflected to the second electrode layer (101) by the reflecting plate (106).

In this structure, the reflecting plate is disposed outside of the device, and thus the material and process for forming the reflecting plate are not limited. The reflecting plate may be used, a reflecting plate having measured reflexibility of 80% or more, 85% or more, 90% or more or 95% or more, relative to light of a wavelength of 550 nm.

The dielectric mirror is also called a Bragg mirror, and conventionally includes a structure in which multiple thin films formed of a dielectric material are deposited on a substrate layer formed of glass or another optical material. The dielectric minor may have a reflexibility in a predetermined range by wavelengths of light, and ensure a very high reflexibility relative to light having a wavelength in a predetermined range by controlling the thickness and material of the thin film of the dielectric material. The kind of the dielectric minor included in the OLED is not particularly limited, and a suitable kind may be selected to use in consideration of a wavelength of light emitted from the organic layer or desired reflexibility.

As the reflecting plate, the Ag, Al or $BaSO_4$ layer deposited on a suitable substrate, or a film, sheet or substrate formed of the above material may also be used.

The OLED may easily ensure a distance between an emitting region of the organic layer and a region reflecting emitted light by using the electrode layers formed on both sides of the organic layer described above and disposing the reflecting plate outside of at least one of the transparent electrode layer, and thus evanescent coupling is minimized by surface plasmons, resulting in achieving excellent light efficiency. Also, as the reflecting plate is disposed outside of the electrode layer, loss by the absorption of light in the reflective region is minimized, and as a limitation on the material for the substrate layer on which the device is formed is removed, for example, a film-type substrate layer having a limitation in use due to difficult matching in refractive index may also be used without limitation. The reflecting plate, or when necessary, a region exhibiting a reflective characteristic thereof, may be patterned.

As aforementioned, in the OLED, the reflecting plate may be maintained a suitable gap with the emitting layer located in the organic layer. Accordingly, the surface Plasmon effect of the device may be minimized, and the light extraction efficiency and the like may be optimized.

The OLED may also include a low refractive region between the reflecting plate and an electrode layer adjacent to the reflecting plate, for example, between the substrate layer and the reflecting plate. The term "low refractive region" used herein may refer to a region having a refractive index of about 1.6 or less, about 1.55 or less, about 1.5 or less, about 1.45 or less, about 1.40 or less, about 1.35 or less, about 1.30 or less, about 1.25 or less, about 1.00 or less, about 0.8 or less to about 1.0 or less, or about 0.85 or less to about 1.0.

FIG. 10 is a diagram showing that a low refractive region (1001) is further formed in the OLED having the structure of FIG. 1. In FIG. 10, the low refractive region (1001) is formed between a substrate layer (105) and a reflecting plate (106).

The low refractive region may be, for example, an air layer, or a layer of an inorganic or organic material having a refractive index of aforementioned range.

To form the low refractive region as an air layer, for example, a method of giving a suitable gap between the substrate layer and the reflecting plate may be used.

Another material for forming the low refractive region may be, for example, an inorganic material such as $MgF_2$, NaF, KF, $Bi_2S_3$, $Na_5Al_3F_{14}$ or $SiO_2$, or a polymer having a low refractive index, for example, various photo-curable polymers and the like. A method of forming the low refractive region by using the above material is not particularly limited, and for example, a vacuum deposition process such as deposition, plasma chemical vapor deposition (CVD) or sputtering, or a method of applying and curing a coating solution including an organic polymer or a precursor thereof may be used.

When the low refractive region is formed, the gap between the emitting region of the emitting layer and the reflecting plate may be more effectively controlled, and light loss by the reflecting plate also may be minimized. Also, when the reflecting plate is in contact with the low refractive region, a reflective characteristic of the reflecting plate is more enhanced, and thus the efficiency of the device may be more improved. In addition, for example, when the reflecting plate is cohered to the substrate layer, loss, for example, absorption loss by the reflecting plate relative to lights at all angles, occurs, but when the low refractive region is formed as described above, loss by the reflecting plate relative to one of lights incident to the reflecting plate, which is incident at a larger angle than the critical angle may be prevented. A thickness of the low refractive region is not particularly limited, and for example, the low refractive region may have a suitable thickness in consideration of the gap between the emitting region and the reflecting plate described above.

The OLED may be present in a suitable encapsulating structure to prevent external moisture or oxygen. That is, the OLED may further include an encapsulating structure for protecting the transparent electrode layer and the organic layer. The encapsulating structure may be, for example, a can formed of glass or metal, or a film covering an entire surface of the organic layer.

FIG. 11 shows that an encapsulating structure (1101) having a can type such as a glass can or a metal can is further included to protect a second transparent electrode (101) and an organic layer (102), which are sequentially formed. As shown in FIG. 11, for example, the encapsulating structure (1101) may be attached to the electrode layer (103) by an adhesive (1102). The encapsulating structure, for example, may be adhered to the electrode layer (103) below which a scattering layer (104) is not located. For example, the encapsulating structure (1101) as shown in FIG. 11 may be attached to the electrode layer (103) present at an edge of the substrate layer (105) by the adhesive (1102). In such a method, a protecting effect through the encapsulating structure may be maximized.

The encapsulating structure may be, for example, a film coating entire surfaces of the organic layer and the second electrode layer. FIG. 12 shows an encapsulating structure (1101) formed in a film type covering entire surfaces of the organic layer (102) and the second electrode layer (101). For example, as shown in FIG. 12, the film-type encapsulating structure (1101) may have a structure which coats entire surfaces of the organic layer (102) and the second electrode layer (101), and in which a substrate layer (105) including a scattering layer (104) and a first electrode layer (103) is adhered to a second substrate (1201) disposed thereon. Here, the second substrate (1201) may be, for example, a glass substrate, a metal substrate, a polymer film, or a barrier layer. The film-type encapsulating structure may be formed by, for example, coating a liquid material cured by heat or UV irradiation such as an epoxy resin, and curing the coated material, or laminating the substrate and the upper substrate using an adhesive sheet previously manufactured in a film type using the epoxy resin.

The encapsulating structure may include a water adsorbent or a getter such as a metal oxide such as calcium oxide or beryllium oxide, a metal halide such as calcium chloride, or phosphorus pentoxide, if necessary. For example, the water adsorbent or getter may be included in a film-type encapsulating structure, or located at a predetermined position of a can-type encapsulating structure. The encapsulating structure may further include a barrier film or conductive film.

For example, as shown in FIG. 11 or 12, the encapsulating structure may be adhered to the top of the first electrode layer (103) below which the scattering layer (104) is not formed. Thus, a sealing structure in which the optical functional layer is not exposed to an external environment may be embodied. The sealing structure may refer to, for example, a state in which an entire surface of the scattering layer is surrounded by the substrate layer, the electrode layer, and/or the encapsulating structure, or by the sealing structure formed by including the substrate layer, the electrode layer, and/or the encapsulating structure, thereby preventing exposure of the scattering layer to an external environment. The sealing structure may include only the substrate layer, the electrode layer, and/or the encapsulating structure, or also include another component, for example, a conductive material or an intermediate layer with the substrate layer, the electrode layer, and the encapsulating structure as long as the optical functional layer is not exposed to an external environment. For example, in FIG. 11 or 12, another component may be present in a part in which the substrate layer (101) is in contact with the electrode layer (103) or in which the first electrode layer (103) is in contact with the encapsulating structure (1201), or at another position. As the component, an organic material, inorganic material, or organic/inorganic combination material having low moisture permeability, or an insulating layer or an auxiliary electrode may be used.

The present application also relates to a use of the OLED. The OLED may be effectively applied to, for example, a backlight of a liquid crystal display (LCD), lightings, sensors, printers, a light source of a copy machine, a light source for an automobile gauge, a signal light, a pilot lamp, a display device, a light source for a planar emitting device, a display, decoration or other kinds of lights, and the like. In one embodiment, the present application relates to a lighting device including the OLED. When the OLED is applied to the lighting device or for different uses, other components constituting the device and a method of constituting the device are not particularly limited, but all of optional materials or methods known in the related art may be employed as long as these are used in the OLED.

DETAILED DESCRIPTION OF EXEMPLARY EMBODIMENTS

Hereinafter, the OLED will be described in detail with reference to Examples and Comparative Examples. However, the present invention is not limited to the embodiments disclosed below, but the present invention is not limited by Examples to be described below.

EXAMPLE 1

Figure 1:
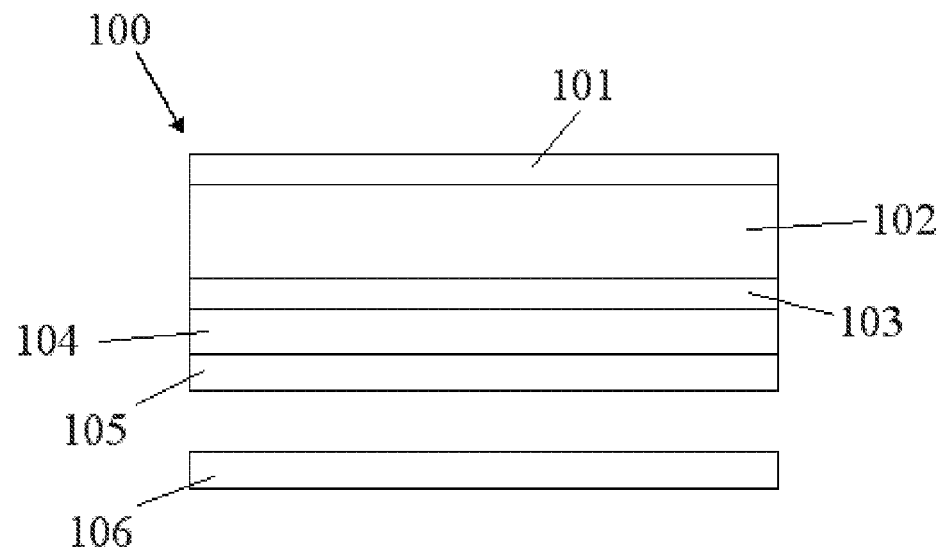
FIG. 1 is a diagram of an exemplary OLED.
Figure 2:
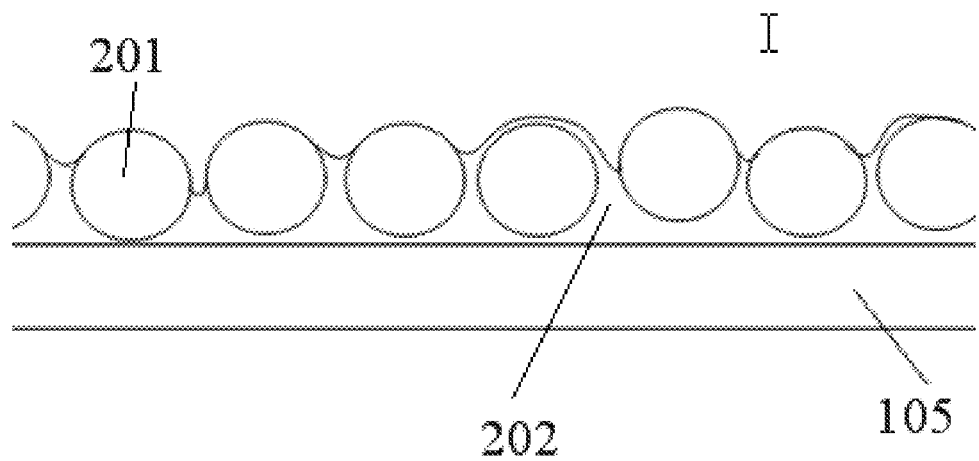
FIGS. 2 and 3 are diagrams of an exemplary scattering layer.
Figure 3:
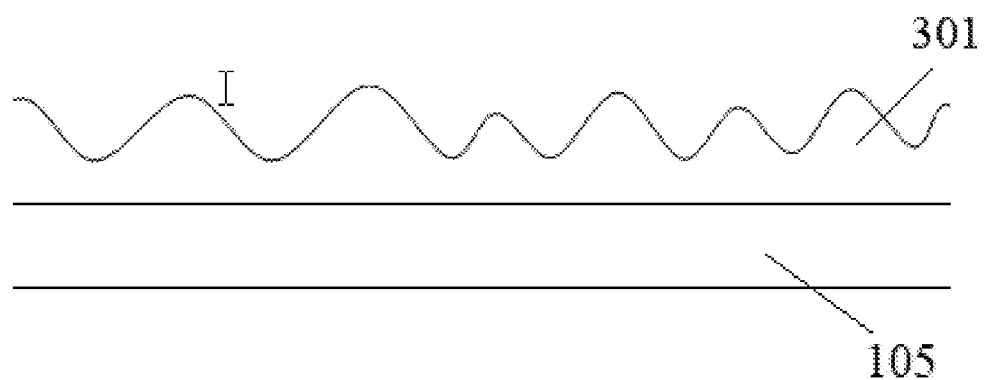
Figure 4:
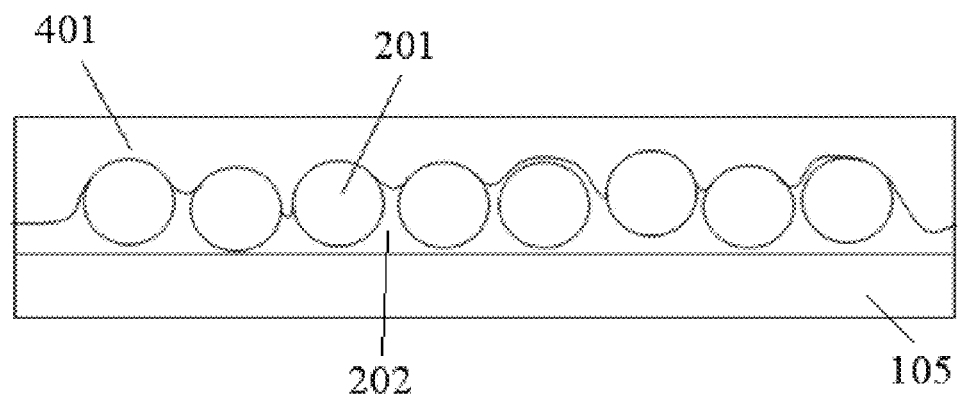
FIGS. 4 and 5 are diagrams showing that a planarized layer is formed on a scattering layer.
Figure 5:
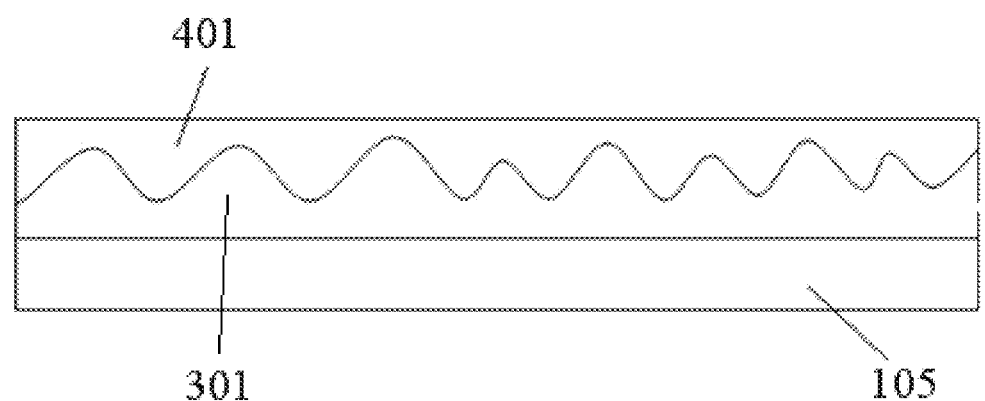
Figure 6:
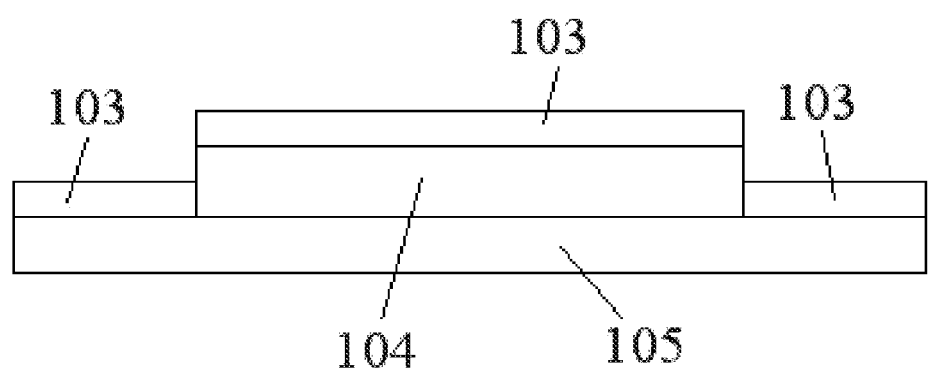
FIGS. 6 to 8 are diagrams showing exemplary types of a scattering layer and an electrode layer.
Figure 7:
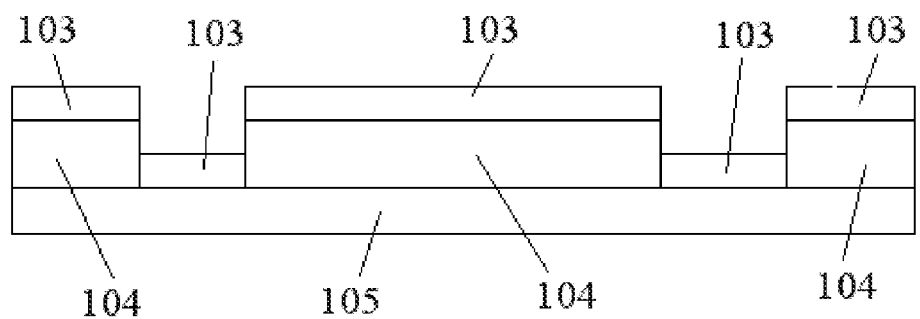
Figure 8:
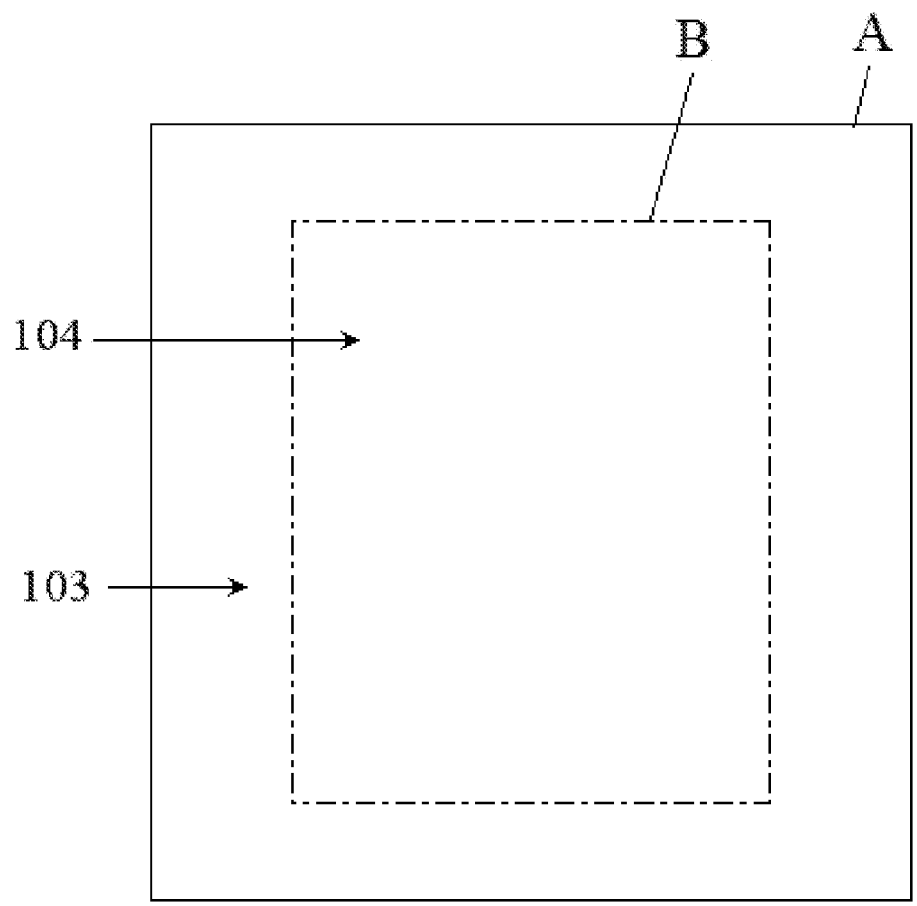
Figure 9:
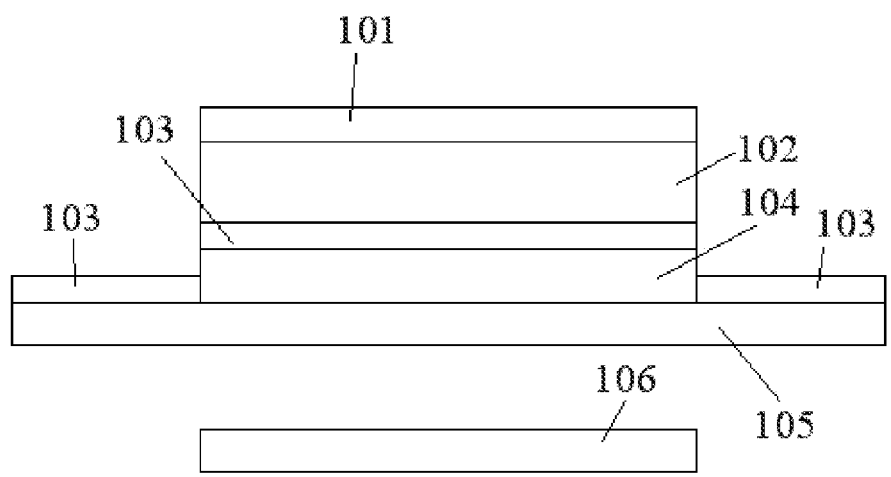
FIGS. 9 to 12 are diagrams of exemplary OLEDs.
Figure 10:
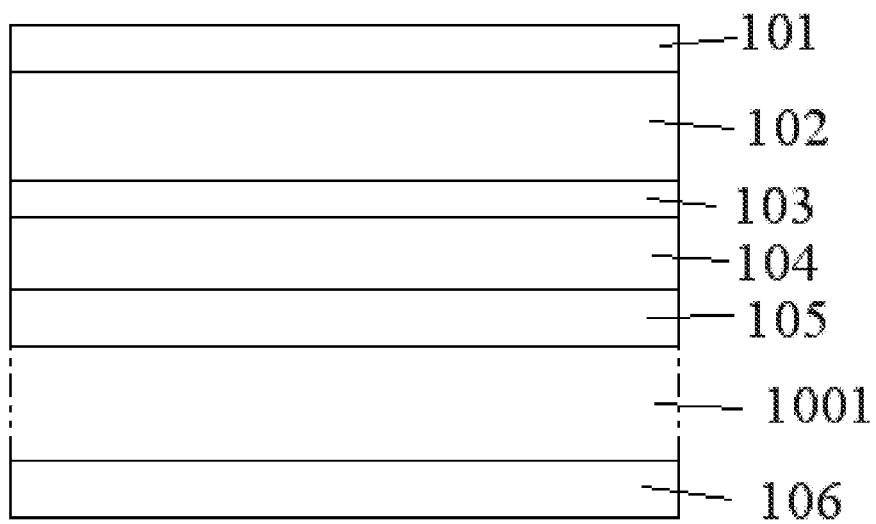
Figure 11:
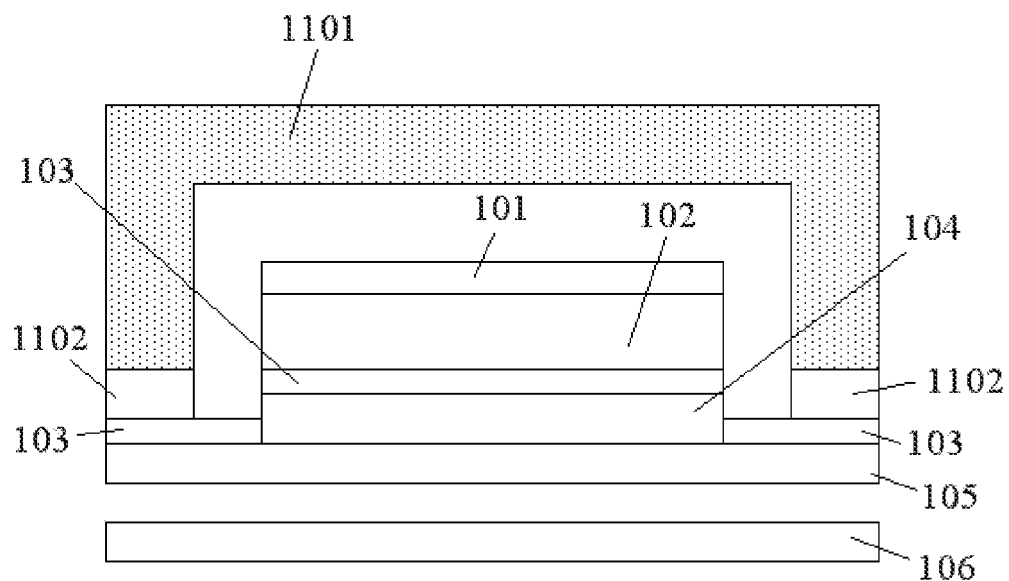
Figure 12:
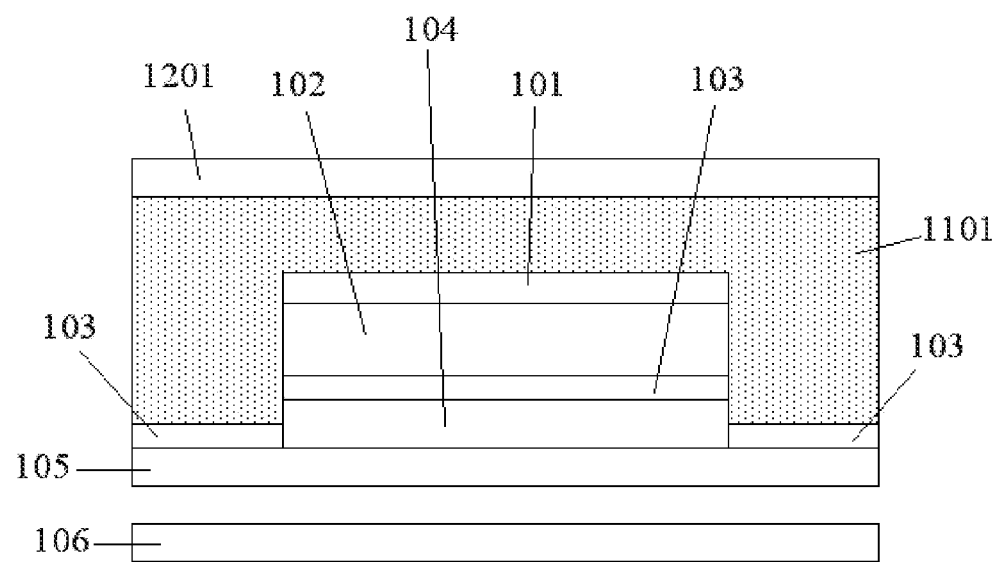

An OLED having the structure shown in FIG. 9 was manufactured. First, to form a scattering layer (104) and a planarized layer on a glass substrate (105), a coating solution for a light scattering layer prepared by blending scattering particles (titanium oxide particles) having an average diameter of about 200 nm in a sol-gel coating solution including tetramethoxy silane as a condensable silane and sufficiently dispersing the solution was coated on an entire surface of the substrate (105). Subsequently, a scattering layer was formed by removing a part of the coating layer of the coating solution using a fabric soaked with acetone such that a position of the remaining light scattering layer corresponded to an emitting region in consideration of a position of the emitting layer of an organic layer (102) to be formed later, and performing a sol-gel reaction. Afterward, likewise, after a high refractive coating solution prepared by blending high refractive titanium oxide particles having an average diameter of about 10 nm and a refractive index of about 2.5 in the sol-gel coating solution including tetramethoxy silane was coated on the top of the scattering layer, a coating layer of the high refractive coating solution was partially removed using a fabric soaked with acetone such that the position of a remaining planarized layer corresponded to the emitting region, and a projection area corresponded to that of the scattering layer in consideration of the position of the emitting layer of the organic layer (102) to be formed later. Subsequently, a planarized layer having a refractive index of about 1.8 was formed by performing a sol-gel reaction on the planarized layer. After removal, a transparent hole injection electrode layer (103) formed of indium tin oxide (ITO) was formed on an entire surface of the glass substrate (105) by a known sputtering method. In addition, a hole injection layer, a hole transport layer, an emitting layer, an electron transport layer and an electron injection layer were formed using known materials and methods, and a transparent electron injection electrode layer was formed again as a second electrode layer. Subsequently, as a reflecting plate, a film (106) (reflexibility of the reflecting surface (Al): about 89.22% relative to a wavelength of 550 nm using a visible spectrophotometer) on which a deposition layer of Al was formed was disposed to have a gap with the emitting layer of about 150 nm, and thus the OLED was completed.

EXAMPLE 2

An OLED was manufactured as described in Example 1, except that a film (106) on which a deposition layer of Ag was formed (reflexibility of the reflecting surface(Al): about 97.10% relative to a wavelength of 550 nm using a visible spectrophotometer) was used as a reflecting plate.

COMPARATIVE EXAMPLE 1

An OLED was manufactured as described in Example 1, except that a light scattering layer and a planarized layer were not formed.

COMPARATIVE EXAMPLE 2

An OLED was manufactured as described in Example 2, except that a light scattering layer and a planarized layer were not formed.

EXPERIMENTAL EXAMPLE 1

Measurement of Efficiency of Device

Efficiencies (Q.E.) of the devices according to Examples 1 and 2 and Comparative Examples 1 and 2 were measured, and the results are listed in Table 1. In the configuration of the device according to the results of Table 1, it was confirmed that excellent efficiency was ensured due to a structure in which both of the electron and hole injection electrodes were used as transparent electrodes, a reflecting plate was disposed outside of the device, and a scattering layer was again disposed. In addition, as the reflexibility of the reflecting plate disposed outside was increased, the efficiency of the device was improved.

TABLE 1

|  | Example 1 | Example 2 | Comparative Example 1 | Comparative Example 2 |
| --- | --- | --- | --- | --- |
| Efficiency of device (Q.E.) | 41.5% | 51.2% | 36.1% | 39.3% |

EXPERIMENTAL EXAMPLE 2

Reflexibility of Reflecting Plate by Presence of Low Refractive Layer

Figure 13:
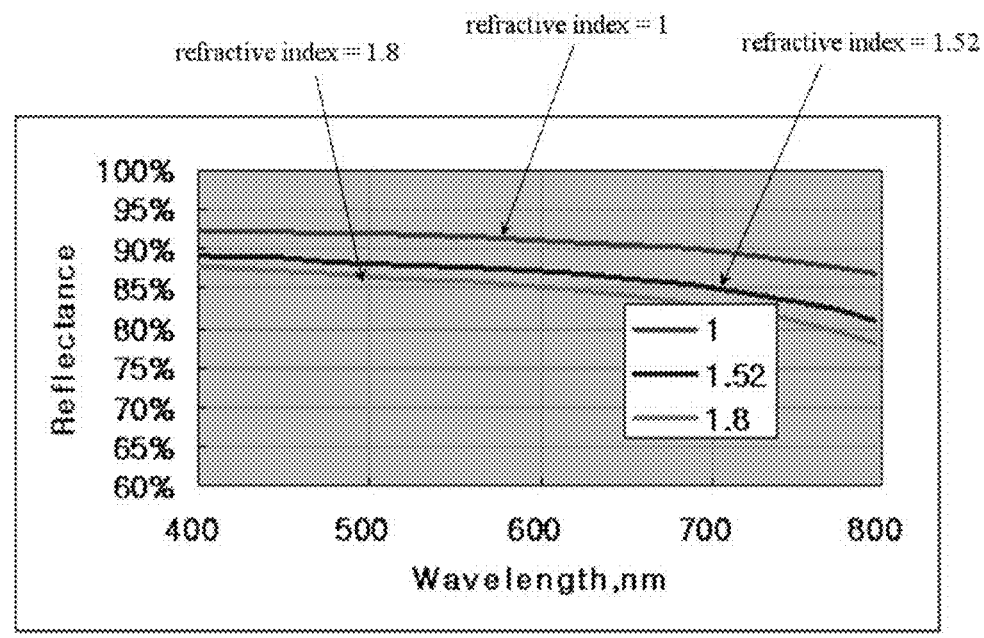
FIGS. 13 and 14 are diagrams showing a change in reflexibility of a reflecting plate according to a refractive index of an adjacent medium.
Figure 14:
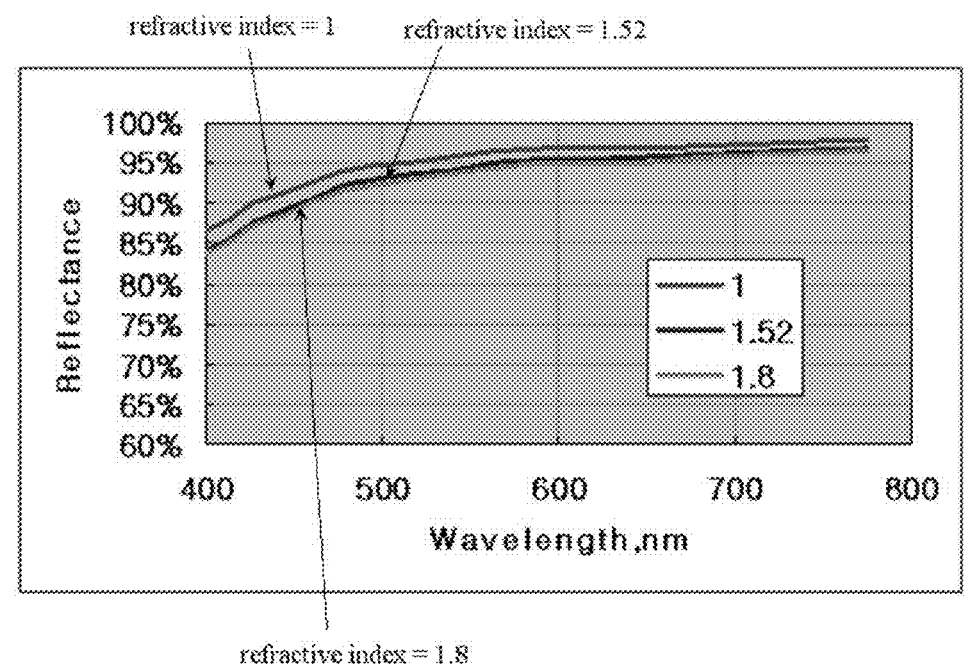

Materials each having refractive indexes of a reflective surface (Ag or Al surface) of 1, 1.52 and 1.8 were in contact with the reflecting plates used in Examples and Comparative Examples, and the reflexibility of the reflecting plate was evaluated using a visible spectrophotometer. FIG. 13 shows the reflexibility according to the refractive index of the adjacent material of the reflecting plate having a reflective surface such as an Al surface, and FIG. 14 shows the reflexibility according to the refractive index of the adjacent material of the reflecting plate having a reflective surface of Ag. As shown in FIGS. 13 and 14, it was confirmed that the reflexibility of the reflecting plate was increased as the refractive index of the adjacent medium was decreased, and thus the efficiency was increased through placement of the low refractive layer in the device.

EXPERIMENTAL EXAMPLE 3

Figure 15:
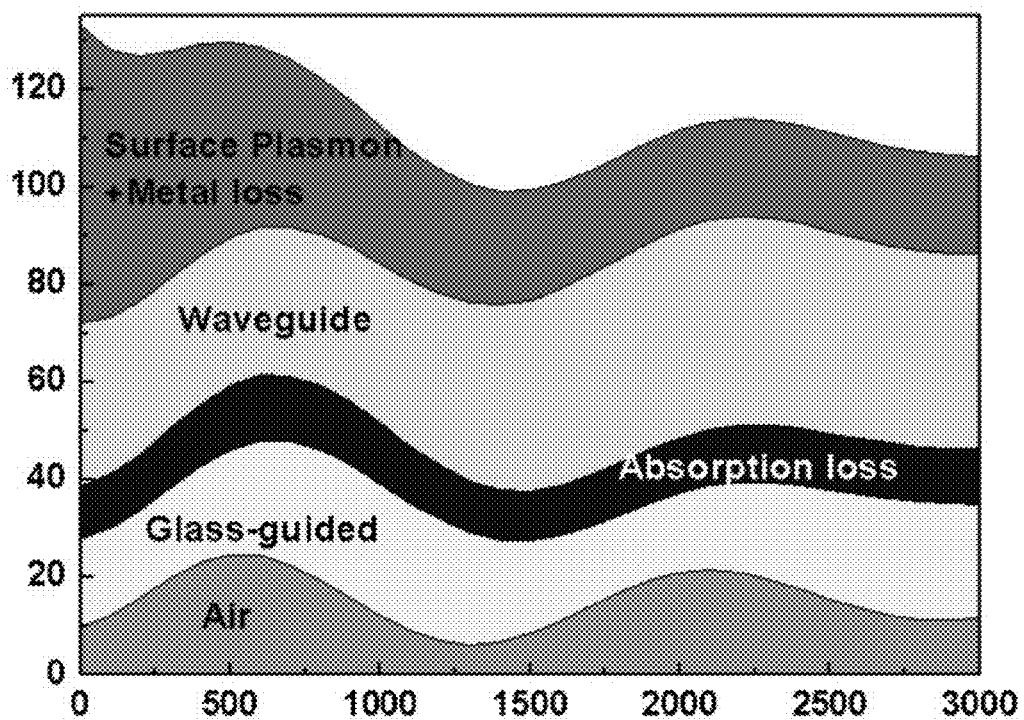
FIG. 15 is a diagram showing a change in dissipated power according to a distance between a reflecting plate and an emitting layer.

Evaluation of Dissipated Power According to Distance Between Emitting Layer and Reflecting Plate Dissipated power of the device was measured by changing the distance between the reflecting plate and the emitting layer relative to the device according to Example 2, and the results are shown in FIG. 15. In FIG. 15, the Y axis shows dissipated power (unit: W/m²), and the X axis shows the distance (unit: Å) between the reflecting plate and the emitting layer. It was confirmed from FIG. 15 that the distance between the reflecting plate and the emitting layer gave an influence to dissipation of power caused by plasmons or light trapping (e.g., glass-guiding) or absorption, and the efficiency of the device was improved by the control of the dissipation of power.

An exemplary OLED according to the present invention can minimize evanescent coupling by surface plasmons, and can have excellent emission efficiency.

While the invention has been shown and described with reference to certain exemplary embodiments thereof, it will be understood by those skilled in the related art that various changes in form and details may be made therein without departing from the scope of the invention as defined by the appended claims.

EXPLANATIONS OF LETTERS OF NUMERALS

100: organic light emitting device (OLED)
101, 103: transparent electrode layer
102: organic layer
104: scattering layer
105: substrate layer
106: reflecting plate
201: scattering particles
202: binder
301: scattering layer
401: planarized layer
1001: low refractive region
1101: encapsulating structure
1102: adhesive
1201: second substrate

What is claimed is:

1. An organic light emitting device comprising:
   a substrate layer;
   a first transparent electrode layer located on the substrate layer;
   an organic layer including an emitting layer and located on the first transparent electrode layer;
   a second transparent electrode layer located on the organic layer;
   a reflecting plate located on a side of the substrate layer, which is an opposite side to a side on which the first transparent electrode layer is formed; and
   a scattering layer located between the substrate layer and the first transparent electrode layer,
   wherein a gap between the emitting layer and the reflecting plate is from 100 nm to 700 nm.

2. The organic light emitting device of claim 1, wherein any one of the first and second transparent electrode layers is a hole injection electrode, and the other one thereof is an electron injection electrode.

3. The organic light emitting device of claim 1, wherein the organic layer further comprises at least one selected from the group consisting of an electron injection layer, a hole blocking layer, an electron transport layer, a hole transport layer and a hole injection layer.

4. The organic light emitting device of claim 1, wherein the reflecting plate comprises a dielectric mirror, BaSO$_4$, silver or aluminum.

5. The organic light emitting device of claim 1, wherein the scattering layer has a projection area smaller than that of the first transparent electrode layer, and the first transparent electrode layer is formed on both of the top of the scattering layer and the substrate layer.

6. The organic light emitting device of claim 5, further comprising:
   an encapsulating structure for protecting the organic layer and the second transparent electrode layer and
   wherein the encapsulating structure is attached to the top of the first transparent electrode layer below which the scattering layer is not formed.

7. The organic light emitting device of claim 6, wherein the encapsulating structure is a glass can or a metal can.

8. The organic light emitting device of claim 6, wherein the encapsulating structure is a film covering entire surfaces of the organic layer and the second transparent electrode layer.

9. An organic light emitting device, comprising:
   a substrate layer;
   a first transparent electrode layer located on the substrate layer;
   an organic layer including an emitting layer and located on the first transparent electrode layer;
   a second transparent electrode layer located on the organic layer;
   a reflecting plate located on a side of the substrate layer, which is an opposite side to a side on which the first transparent electrode layer is formed; and
   a scattering layer located between the substrate layer and the first transparent electrode layer,
   wherein the scattering layer comprises scattering particles having a refractive index of 1.0 to 3.5 and an average diameter of 50 nm to 20,000 nm.

10. An organic light emitting device, comprising:
    a substrate layer;
    a first transparent electrode layer located on the substrate layer;
    an organic layer including an emitting layer and located on the first transparent electrode layer;
    a second transparent electrode layer located on the organic layer;
    a reflecting plate located on a side of the substrate layer, which is an opposite side to a side on which the first transparent electrode layer is formed; and
    a scattering layer located between the substrate layer and the first transparent electrode layer,
    wherein the scattering layer has an uneven structure.

11. An organic light emitting device, comprising:
    a substrate layer;
    a first transparent electrode layer located on the substrate layer;
    an organic layer including an emitting layer and located on the first transparent electrode layer;
    a second transparent electrode layer located on the organic layer;
    a reflecting plate located on a side of the substrate layer, which is an opposite side to a side on which the first transparent electrode layer is formed;
    a scattering layer located between the substrate layer and the first transparent electrode layer; and
    a planarized layer formed on the top of the scattering layer, and having a refractive index of 1.8 to 3.5.

12. The organic light emitting device of claim 11, wherein the planarized layer comprises high refractive particle having an average diameter of 1 nm to 100 nm.

13. The organic light emitting device of claim 12, wherein the high refractive particle is rutile-type titanium oxide.

14. An organic light emitting device, comprising:
    a substrate layer;

a first transparent electrode layer located on the substrate layer;

an organic layer including an emitting layer and located on the first transparent electrode layer;

a second transparent electrode layer located on the organic layer;

a reflecting plate located on a side of the substrate, which is an opposite side to a side on which the first transparent electrode layer is formed;

a scattering layer located between the substrate layer and the first transparent electrode layer; and a low refractive region which is between the reflecting plate and the substrate layer, and having a refractive index of 1 or less.

* * * * *